(12) United States Patent
Osato et al.

(10) Patent No.: US 7,771,220 B2
(45) Date of Patent: Aug. 10, 2010

(54) ELECTRICAL CONNECTING APPARATUS

(75) Inventors: Eichi Osato, Tokyo (JP); Yoshihito Goto, Aomori (JP); Mitsuhiro Abe, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 0 days.

(21) Appl. No.: 12/580,938

(22) Filed: Oct. 16, 2009

(65) Prior Publication Data

US 2010/0099277 A1    Apr. 22, 2010

(30) Foreign Application Priority Data

Oct. 20, 2008 (JP) .............................. 2008-269667

(51) Int. Cl.
*H01R 12/00* (2006.01)
(52) U.S. Cl. ........................................ 439/264; 439/68
(58) Field of Classification Search ............. 439/68–71, 439/259, 263–265, 330, 525–526
See application file for complete search history.

(56) References Cited

U.S. PATENT DOCUMENTS 6,609,923 B2 * 8/2003 Sato et al. ................... 439/259
6,790,064 B2 * 9/2004 Kajiwara ..................... 439/259
6,793,505 B2 * 9/2004 Dishongh et al. .............. 439/71
6,811,410 B2 * 11/2004 Figueroa et al. ............... 439/68

FOREIGN PATENT DOCUMENTS

JP    2002-280317    9/2002
JP    2007-178165    7/2007

* cited by examiner

*Primary Examiner*—Khiem Nguyen
(74) *Attorney, Agent, or Firm*—Bryan A. Santarelli; Graybeal Jackson LLP

(57) ABSTRACT

An embodiment of an electrical connecting apparatus comprises an electrical insulating plate, an elastic plate made of an electrical insulating material arranged on the electrical insulating plate, a sheet-like conductive plate arranged on the elastic plate, and first and second contacts. The conductive plate comprises a hole area having at least one first hole portion allowing the probe tip portion of the first contact to abut to the conductive plate and a plurality of second hole portions not allowing the probe tip portions of the second contacts to abut thereon regardless of whether or not overdriving acts on the contacts.

12 Claims, 14 Drawing Sheets

ELECTRICAL CONNECTING APPARATUS

PRIORITY CLAIM

The instant application claims priority to Japanese Patent Application No. 2008-269667, filed Oct. 20, 2008, which application is incorporated herein by reference in its entirety.

TECHNICAL FIELD

An embodiment of the subject matter relates to an apparatus for electrically connecting a conductive portion of a board such as a wiring board to an electrode portion of a device under test such as an integrated circuit.

BACKGROUND

An electrical test (that is, an electrical inspection) of an integrated circuit is generally performed with use of an apparatus for electrically connecting a conductive portion such as a wiring pattern formed on a surface of a wiring board to an electrode portion such as a lead electrode, a pad electrode, a bump electrode, a projection electrode of the integrated circuit.

As one of the electrical connecting apparatuses of this kind, there is one using a plurality of J-shaped or L-shaped contacts each having a probe rear portion extending in the right-left direction, a deformation portion continuing into the tip end side of the probe rear portion and having an external surface deformed upward, and a probe tip portion continuing into the tip end side of the deformation portion and extending upward. This is generally shown in Japanese Patent Publication No. 2002-280317, which is incorporated herein by reference in its entirety.

This electrical connecting apparatus includes a guide having an opening opened upward and downward so as to receive a device under test, a sheet-like electrical insulating plate arranged in the opening, an elastic plate made of an electrical insulating material arranged on the electrical insulating plate in the opening, and a sheet-like conductive plate arranged on the elastic plate.

Each contact is supported in the electrical insulating plate and the elastic plate so that its probe rear portion may be located at a slit provided in the electrical insulating plate, and so that its probe tip portion may penetrate the elastic plate to extend upward. The electrical connecting apparatus is incorporated into a wiring board in a state where the deformation portion of each contact is thrust to a conductive portion of the wiring board.

An integrated circuit is inserted in the opening of the guide from the upper side and is received on each contact, and an electrode portion is relatively thrust to the tip end of the probe tip portion of the contact. Accordingly, the contact elastically deforms the elastic plate and is thrust to the conductive portion of the wiring board. As a result, the conductive portion of the wiring board and the electrode portion of the integrated circuit are electrically connected.

At the time of a test, at least one conductive portion and a contact thrust to the conductive portion are used for so-called grounding on the negative side (or the positive side) of the power source, several other conductive portions and contacts thrust to the conductive portions are used for so-called powering on the positive side (or the negative side) of the power source, and the remaining conductive portions and contacts thrust to the conductive portions are used for so-called signaling for supply or taking-out of signals.

In the above state, electrical signals are supplied to the integrated circuit via some contacts for signaling while signals from the integrated circuit are taken out via other contacts for signaling, and thus an electrical test of the integrated circuit is performed.

However, in the conventional electrical connecting apparatuses, since the contact is located in an electrical path between each electrode portion of the integrated circuit and the corresponding conductive portion of the wiring board, the electrical effective length between the electrode portion and the conductive portion is long, and the resistance value between the electrode portion and the conductive portion is large. When the resistance value is large in this manner, a test using high frequency signals cannot be performed accurately.

There is proposed an art in which the apparent resistance value of the contact for grounding or powering is reduced for impedance matching to high frequency signals. This is generally shown in Japanese Patent Publication No. 2007-178165, which is incorporated herein by reference in its entirety.

In Japanese Patent Publication No. 2007-178165, a plurality of through holes and a conductive layer are formed in a plate-like electrical insulating block, contacts of pogo-pin type are arranged in the respective through holes, and at least one contact is made to contact the conductive layer. In this technique, the contact contacting the conductive layer is used for grounding (or powering), and the other contacts are used for powering (or grounding) and signaling.

However, in the above conventional art, since each contact is a pogo-pin type, the structure of the contact itself is complicated. Also, a technique to structure the conductive layer so as to bring the contact into contact therewith is complicated, and it is difficult to bring the contact into contact with the conductive layer reliably.

SUMMARY

An embodiment of an electrical connecting apparatus is provided which reduces the apparent resistance value of a contact for grounding or powering in spite of a simple structure.

An electrical connecting apparatus according to an embodiment comprises an electrical insulating plate, an elastic plate made of an electrical insulating material arranged on the electrical insulating plate, a sheet-like conductive plate arranged on the elastic plate, and a plurality of contacts each having a probe rear portion extending in a right-left direction within the electrical insulating plate, a deformation portion continuing into the tip end side of the probe rear portion and having an external surface extended upward, and a probe tip portion continuing into the tip end side of the deformation portion and penetrating the elastic plate and the conductive sheet to extend upward.

The plurality of contacts may comprise first and second contacts. The conductive plate may comprise a hole area having at least one first hole portion allowing the probe tip portion of the first contact to abut to the conductive plate and a plurality of second hole portions not allowing the probe tip portions of the second contacts to abut thereon regardless of whether or not overdriving acts on the contacts.

The conductive plate may have a tongue piece projecting toward the first hole portion so that the probe tip portion of the first contact may abut thereon when overdriving acts on the contacts.

The length of the first hole portion in the right-left direction may be shorter than the length of the second hole portion in the right-left direction.

The first and second hole portions may communicate with one another to cooperatively form an elongated hole extending in a front-back direction. Instead of this, each of the first and second hole portions may include an independent slit extending in the right-left direction.

The electrical insulating plate may have a plurality of slits extending in the right-left direction, the probe rear portion may be received in the slit, and its rear end may abut on a surface defining the slit.

The electrical connecting apparatus according to another embodiment may further comprise an electrical insulating sheet arranged on the conductive plate and a conductive sheet arranged on the electrical insulating sheet. In this case, the probe tip portions of the plurality of contacts may also penetrate the electrical insulating sheet and the conductive sheet and extend upward, and the contacts may comprise at least one first contact and a plurality of second contacts. Further, the conductive sheet may comprise a second hole area having a third hole portion allowing the probe tip portion of at least one contact out of the second contacts to abut to the conductive sheet and a fourth hole portion not allowing the probe tip portions of the remaining contacts out of the second contacts to abut thereon regardless of whether or not overdriving acts on the contacts.

The electrical connecting apparatus according to another embodiment may further comprise a housing having an opening opened to two sides in its thickness direction, the electrical insulating plate and the elastic plate being arranged in the opening. Also, the housing may comprise a plurality of cutouts formed to stride over the conductive portions provided on the board and extending in the right-left direction, and the conductive plate may be arranged on the elastic plate and the housing.

The housing may include a first housing having the opening and a second housing coaxially arranged around the first housing.

The first and second housings may be conductive, the conductive plate may be electrically connected to the first housing, and the conductive sheet may be electrically connected to the second housing.

The electrical connecting apparatus according to another embodiment may further comprise a capacitor arranged in the first or second housing, and one and the other terminals of the capacitor may be electrically connected to the first and second housings, respectively.

The electrical connecting apparatus according to the other embodiment may further comprise a second electrical insulating sheet arranged on the conductive plate or the conductive sheet and a guide arranged on the second electrical insulating sheet and having an opening to receive the device under test, and the probe tip portion may further penetrate the second electrical insulating sheet and make its tip end project upward.

For example, the first contact connected to the conductive plate may be used as either one for grounding or for powering while the second contacts may be used as the other one for grounding and for powering and as one for signaling. Since the probe tip portion of the first contact is connected to the conductive plate, the apparent electrical effective length of the first contact (the length between the electrode portion of the device under test and the conductive plate) is shorter.

As a result of the above, according to the embodiment, as using J-shaped or L-shaped contacts is combined with providing the conductive plate with a plurality of hole portions, in which the first hole portion allows the probe tip portion of at least one contact to abut thereon when overdriving acts on the contacts and in which the second hole portions do not allow the probe tip portions of the other contacts to abut thereon regardless of whether or not overdriving acts on the contacts, the apparent resistance value of the electrical path for grounding or powering is reduced in spite of a simple structure of the conductive plate itself as well as a simple structure of the contact itself. As a result, a test using high frequency signals may be performed accurately.

DETAILED DESCRIPTION

Figure 1:
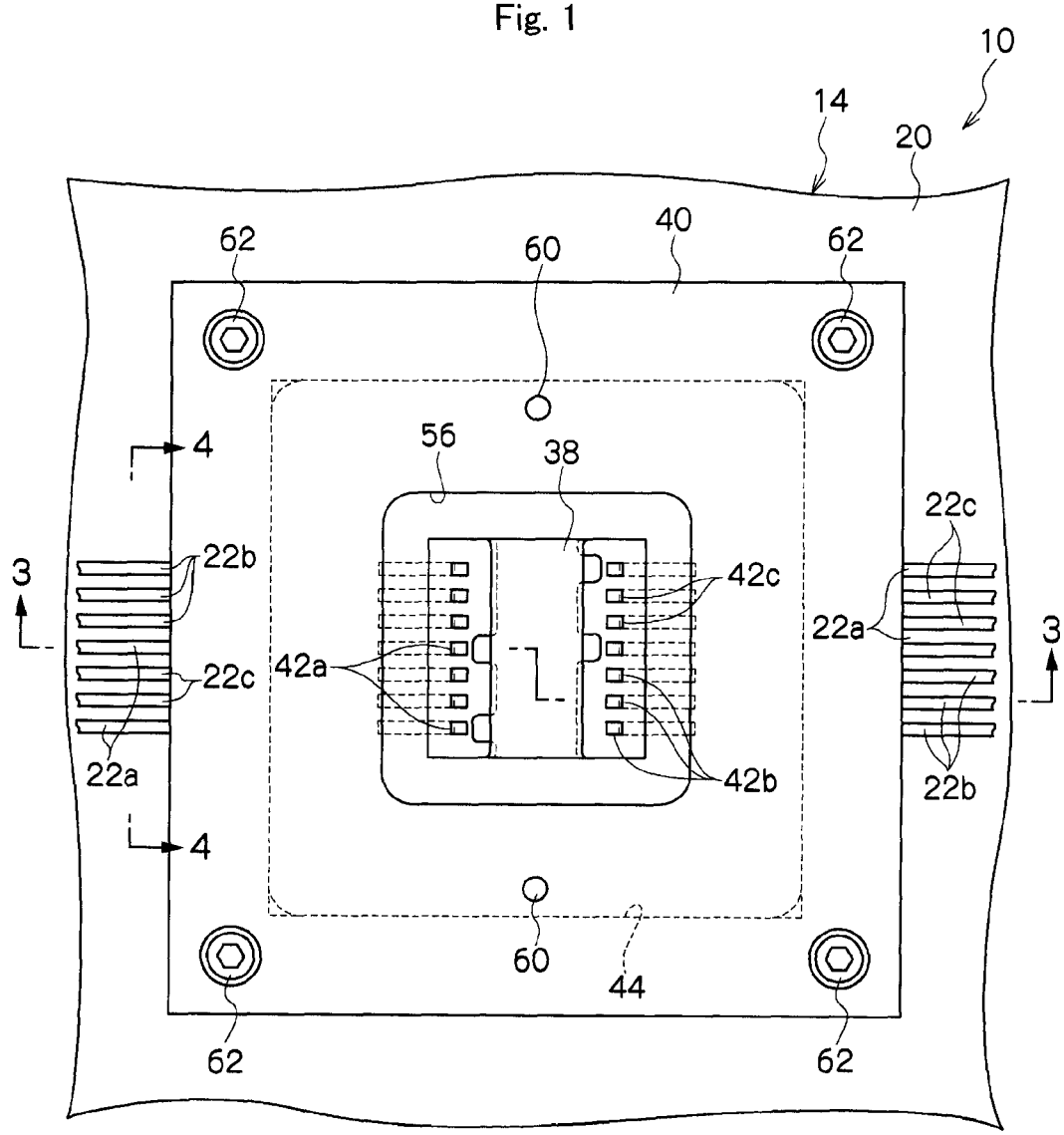
FIG. 1 is a plan view showing a first embodiment of an electrical connecting apparatus.
Figure 2:
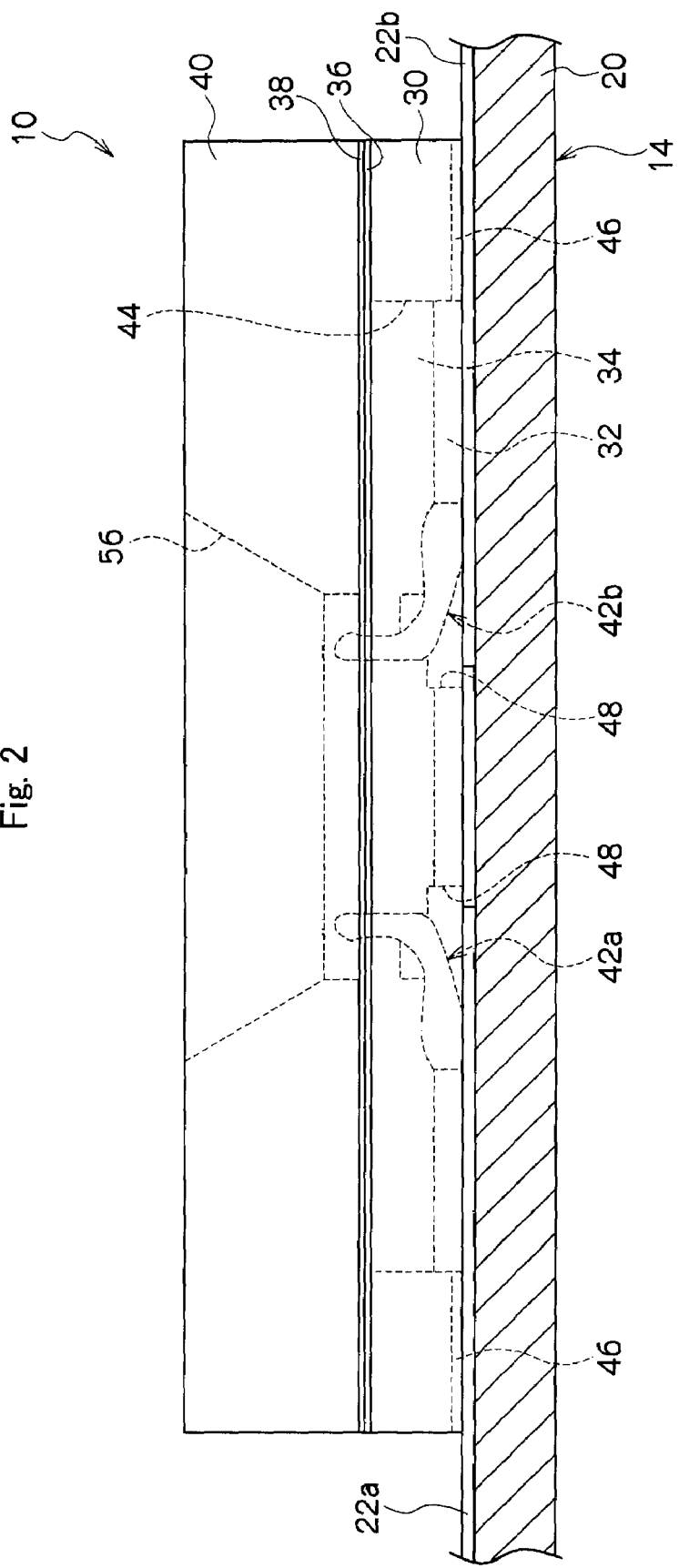
FIG. 2 is a front view of an embodiment of the electrical connecting apparatus shown in FIG. 1.
Figure 3:
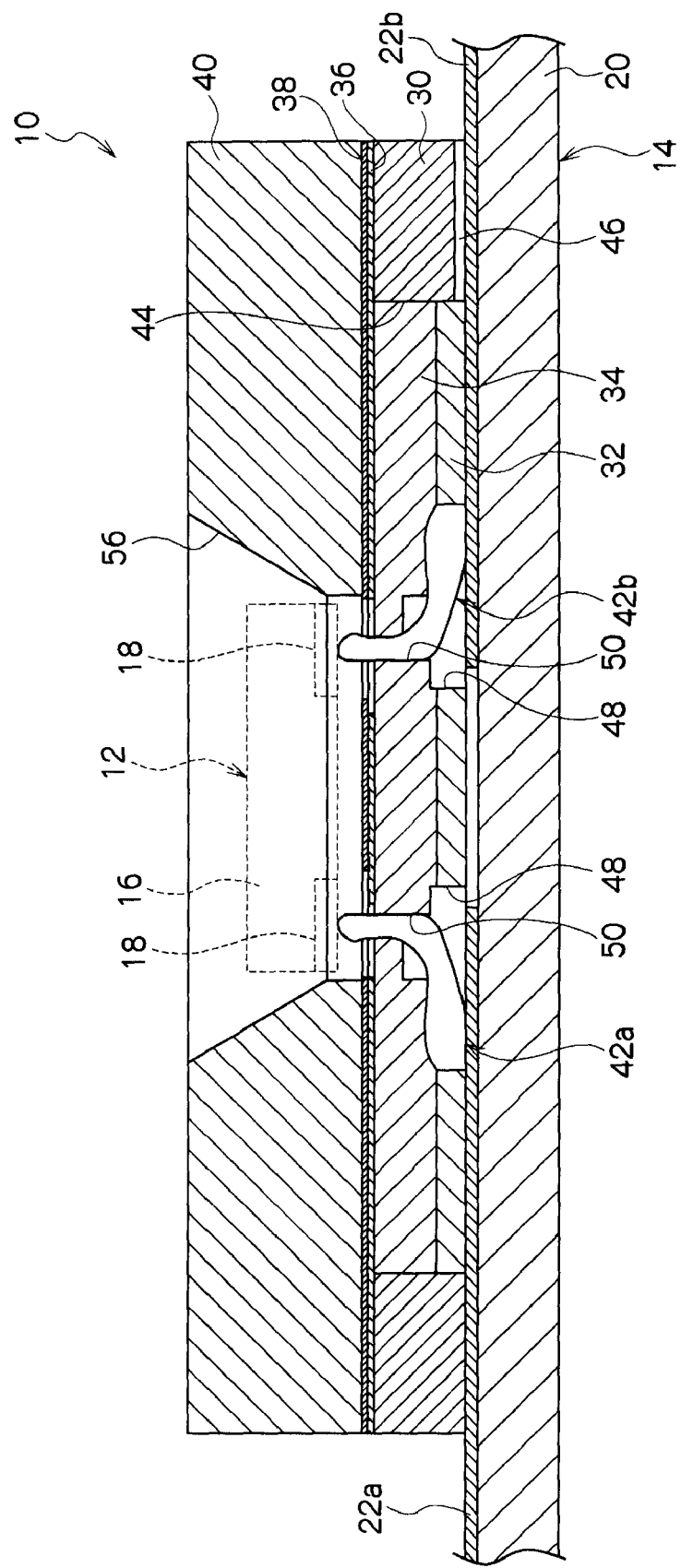
FIG. 3 is a cross-sectional view obtained along the line 3-3 in FIG. 1.
Figure 4:
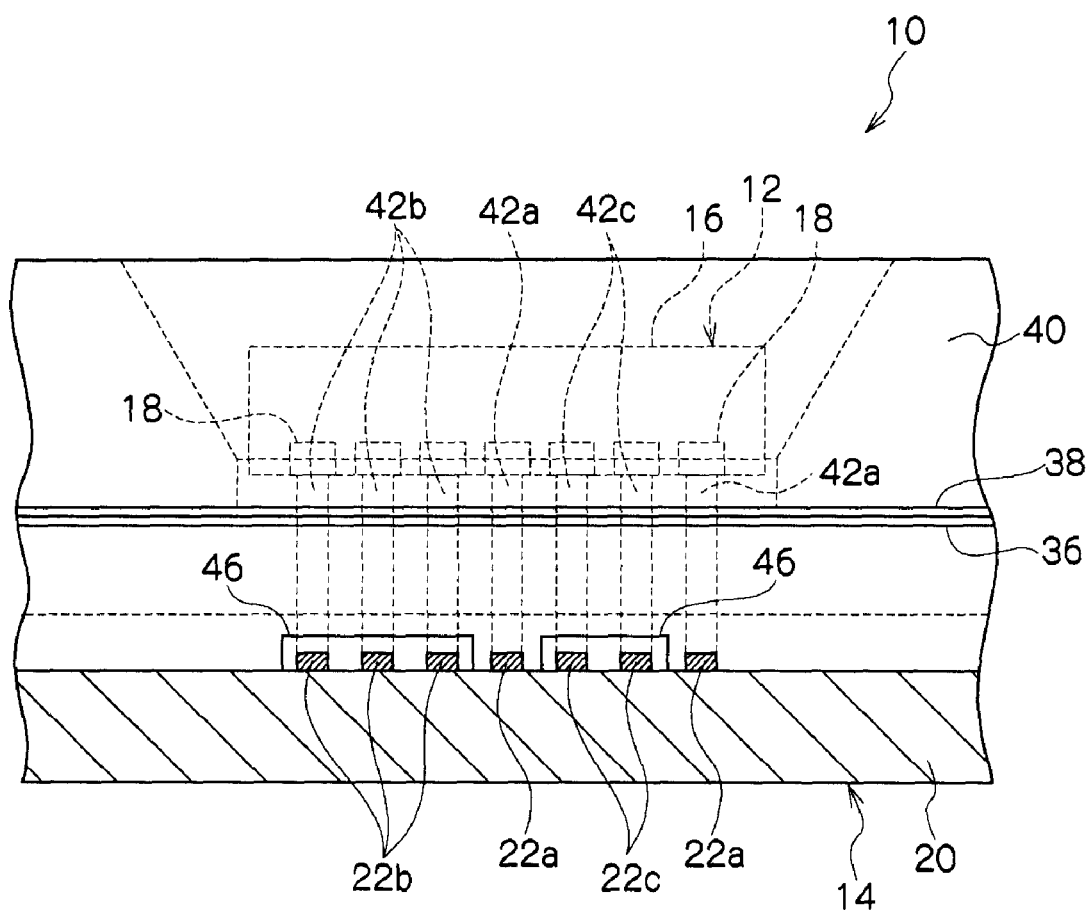
FIG. 4 is a cross-sectional view obtained along the line 4-4 in FIG. 1.

In embodiments, in FIG. 1, a right-left direction is referred to as a right-left direction (X direction), a up-down direction is referred to as a front-back direction (Y direction), and a direction perpendicular to the drawing sheet is referred to a up-down direction (Z direction). However, these directions differ with the posture in which a device under test is arranged in a testing apparatus.

Accordingly, as for the above directions, a plane (XY plane) including the right-left direction (X direction) and the front-back direction (Y direction) is determined to be within any one plane of a horizontal plane, an inclined plane inclined to the horizontal plane, and a vertical plane vertical to the horizontal plane in accordance with the posture of the device under test at the time of an test by the testing apparatus.

Referring to FIGS. 1 to 5, an embodiment of an electrical connecting apparatus 10 is used with a board 14 as a socket for use in an electrical test or an electrical inspection of a flat-plate-like device under test 12 such as an integrated circuit.

The device under test 12 comprises a plate-like main body 16 and a plurality of flat electrode portions 18 arranged on one surface of the main body 16. The electrode portions 18 are arranged in two rows spaced in the right-left direction and are spaced in the front-back direction per electrode portion row in the example shown in the figures.

The board 14 is a wiring board made by forming a wiring pattern on a plate member 20 made of an electrical insulating material by a printed wiring technique and exposes part of the wiring pattern as a plurality of conductive portions 22 individually corresponding to the electrode portions 18 of the device under test 12.

The conductive portions 22 correspond to the electrode portions 18 in one-to-one relationship. Thus, the conductive portions 22 are also arranged in two rows spaced in the right-left direction and are spaced in the front-back direction per conductive portion row. Among the plurality of conductive portions 22, some conductive portions 22 are used for grounding while the other conductive portions 22 are used for signaling and powering.

In the figures, a conductive portion 22 for grounding is shown by adding a of the alphabet to its reference sign, 22, and conductive portions 22 for signaling and powering are respectively shown by adding b and c of the alphabet to their reference signs, 22.

The conductive portion 22a for grounding is used as a terminal on the negative side (or the positive side) of the direct-current power source, the conductive portion 22b for signaling is used as a terminal for supply or taking-out of signals, and the conductive portion 22c for powering is used as a terminal on the positive side (or the negative side) of the direct-current power source.

However, the conductive portion 22a may be used as a terminal on the positive side (or the negative side) of the direct-current power source, and the conductive portion 22c may be used as a terminal on the negative side (or the positive side) of the direct-current power source (that is, a terminal for grounding).

A socket, or the electrical connecting apparatus 10, includes a frame-like housing 30, a sheet-like electrical insulating plate 32 arranged in the housing 30, an elastic plate 34 made of an electrical insulating material arranged to be piled on the electrical insulating plate 32, a sheet-like conductive plate 36 arranged to be piled on the housing 30 and the elastic plate 34, an electrical insulating sheet 38 arranged to be piled on the conductive plate 36, a guide 40 arranged to be piled on the electrical insulating sheet 38, and a plurality of contacts 42 corresponding in one-to-one relationship to the electrode portions 18 of the device under test 12 and the conductive portions 22 of the board 14.

The housing 30 is formed in a rectangular plate shape by a conductive plate-like member, is formed in a rectangular frame shape by having at the central area a rectangular opening 44 opened to both sides (upper and lower sides) in the thickness direction, and has a plurality of cut-outs 46 opened downward at one end and the other end of the lower end portion in the right-left direction.

Each cut-out 46 is a groove extending in the right-left direction so as to make the opening 44 communicate with the space external to the housing 30 and is formed to stride over the conductive portions 22b and 22c for signaling and powering to prevent the housing 30 from contacting to the conductive portions 22b and 22c. Accordingly, the conductive portions 22a, 22b, and 22c are prevented from short-circuiting one another.

The electrical insulating plate 32 is made of an electrical insulating material such as polyimide resin to be formed in a rectangular sheet shape having a predetermined thickness dimension and approximately the same size as the opening 44, and is arranged on the wiring board 14 so as to positioned within the opening 44 of the housing 30.

Figure 9:
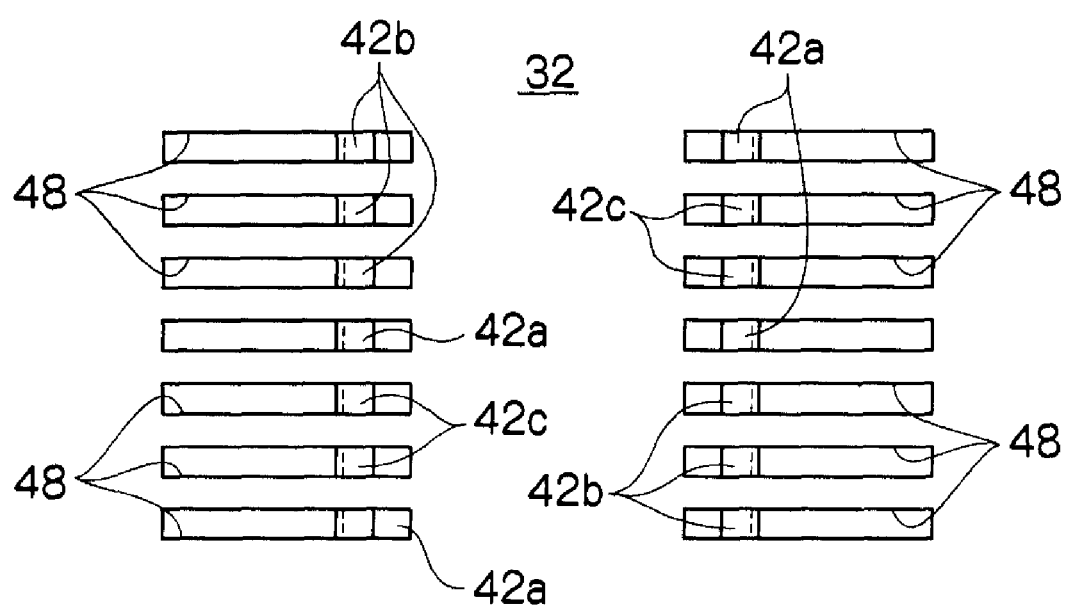
FIG. 9 is a plan view showing an embodiment of the vicinity of slits of an electrical insulating plate.

The electrical insulating plate 32 has at the central area a plurality of slits 48 corresponding in one-to-one relationship to the conductive portions 22, as shown in FIG. 9. The plurality of slits 48 extend in the right-left direction over the corresponding conductive portions 22, are arranged in two rows spaced in the right-left direction, and is spaced in the front-back direction per slit row.

The elastic plate 34 is made of a rubber material with electrical-insulating and springy properties that may be elastically deformed in a three-dimensional manner such as a silicone rubber, is formed in a rectangular shape having approximately the same size as the electrical insulating plate 32, and is arranged on the electrical insulating plate 32 so as to positioned within the opening 44 of the housing 30.

Figure 8:
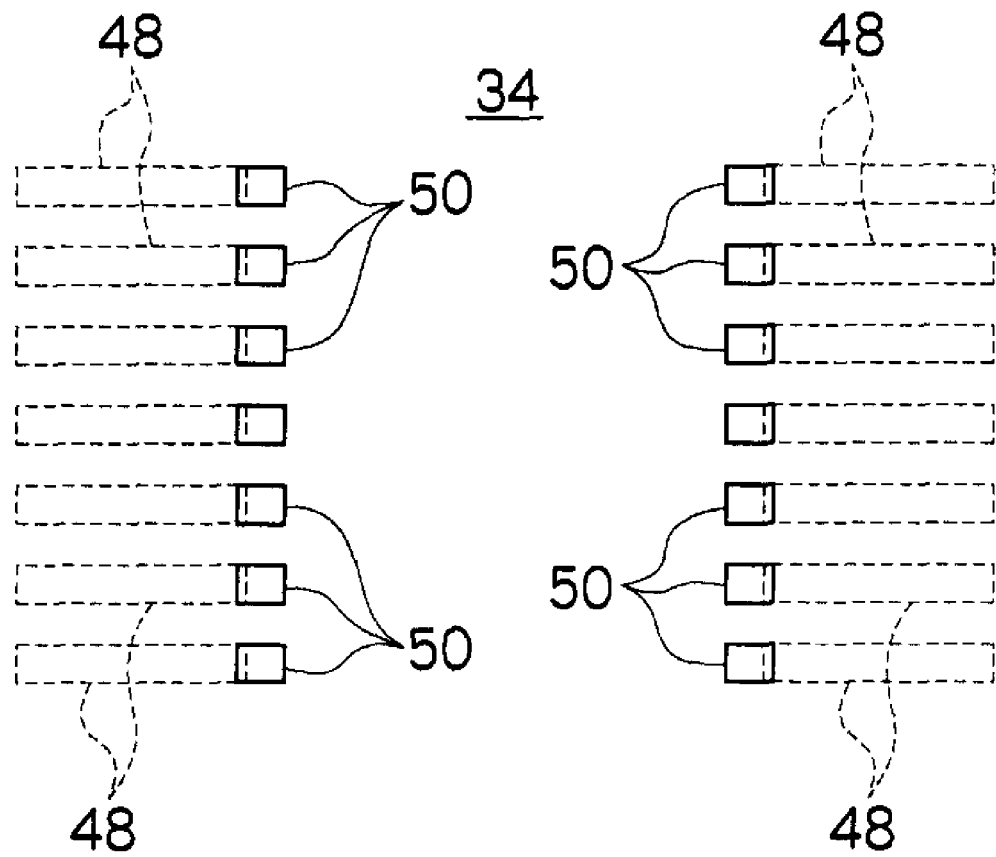
FIG. 8 is a plan view showing an embodiment of the vicinity of holes of an elastic plate.

The elastic plate 34 has at the central area a plurality of holes 50 corresponding to the slits 48 in one-to-one relationship, as shown in FIG. 8. Each hole 50 is located at a position corresponding to one end portion of the corresponding slit 48 and is a through hole passing through the elastic plate 34 in the thickness direction. These holes 50 are also arranged in two rows spaced in the right-left direction and are spaced in the front-back direction per hole row.

The conductive plate 36 is made of a sheet-like plate member with conductive and springy properties such as beryllium, is formed in a rectangular shape having approximately the same size as the housing 30, and is arranged on the housing 30 and the elastic plate 34.

Figure 7:
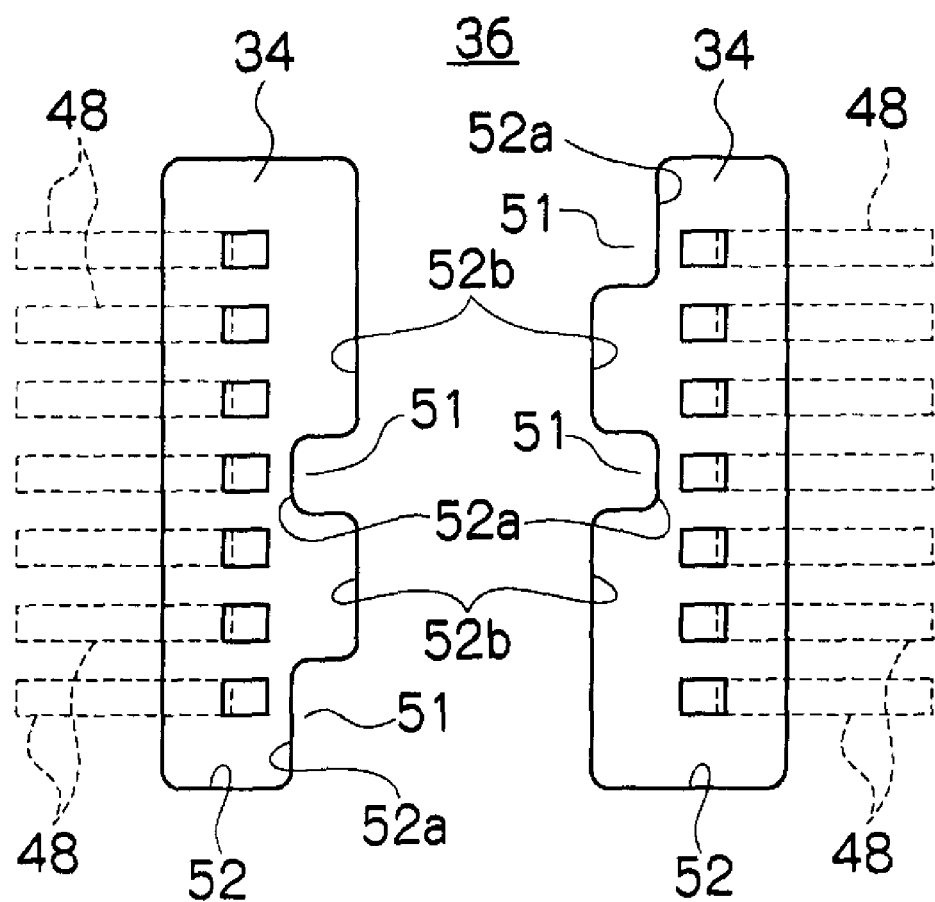
FIG. 7 is a plan view showing an embodiment of the vicinity of elongated holes of a conductive plate.

The conductive plate 36 has a pair of elongated holes 52 spaced in the right-left direction, as shown in FIG. 7. Each elongated hole 52 corresponds to all holes 50 in one (or the other) hole row and extends in the front-back direction over the corresponding holes 50 so that the corresponding holes 50 may expose upward.

Portions located on the mutually near sides of both the elongated holes 52 are formed in uneven shapes so that the distances from the other sides (lengths in the right-left direction) may differ at a plurality of portions. Accordingly, a plurality of first and second hole portions 52a and 52b having different lengths in the right-left direction and communicating in the front-back direction are formed.

Each first hole portion 52a corresponds to the conductive portion 22a and is located over the corresponding conductive portion 22a and hole 50. The second hole portion 52b corresponds to the plural conductive portions 22b or 22c and is located over the corresponding conductive portions 22b or 22c and other holes 50.

The length of the first hole portion 52a in the right-left direction (distance from one edge portion to the other edge portion of the elongated hole 52) is shorter than the length of the second hole portion 52b in the right-left direction. In the example shown in the figure, the length of the first hole portion 52a in the right-left direction is made to be shorter than that of the second hole portion 52b by a tongue piece 51 projecting toward the elongated hole 52.

The electrical insulating sheet 38 is made of an electrical insulating material such as polyimide resin, is formed in a rectangular thin-plate shape having approximately the same size as the conductive plate 36, and is arranged on the conductive plate 36.

Figure 6:
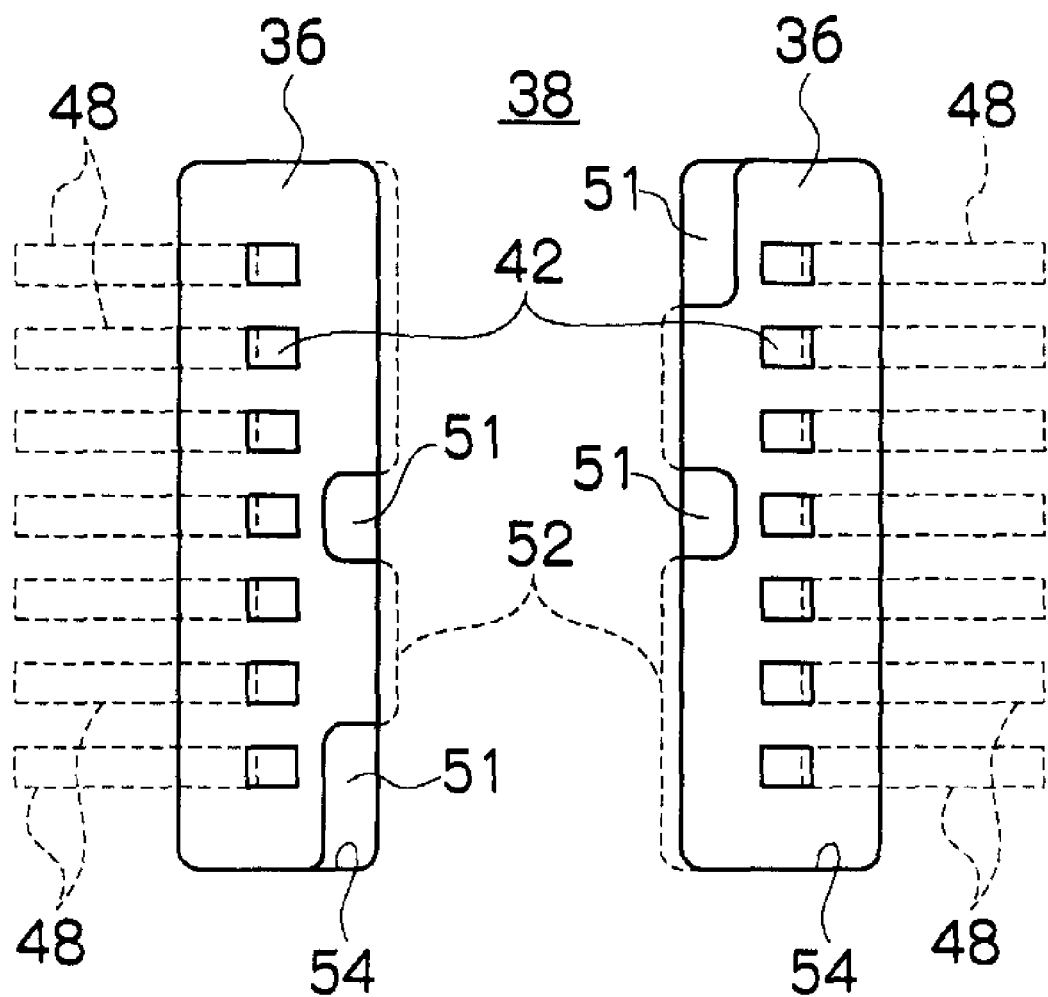
FIG. 6 is a plan view showing an embodiment of the vicinity of elongated holes of an electrical insulating sheet.

The electrical insulating sheet 38 has a pair of rectangular elongated holes 54 spaced in the right-left direction, as shown in FIG. 6. Each elongated hole 54 corresponds to the elongated hole 52 and extends in the front-back direction over the corresponding elongated hole 52 so as to overlap the corresponding elongated hole 52.

The position of each elongated hole 54 on one end side (base end side) in the right-left direction corresponds to that of the elongated hole 52. However, the position of each elongated hole 54 on the other end side in the right-left direction is located further on one end side than that of the elongated hole 52 so that the length of each elongated hole 54 in the right-left direction may be longer than that of the first hole portion 52a and may be shorter than that of the second hole portion 52b.

The guide 40 may be made of an electrical insulating material such as synthetic resin, formed in a rectangular plate shape having approximately the same size as the electrical insulating sheet 38, and arranged on the electrical insulating sheet 38. The guide 40 has an opening 56 to receive the device under test 12.

The opening 56 has a regulating portion formed by a square cylindrical surface so as to regulate the position of the device under test 12 against the connecting apparatus 10 and an inclined portion located on the upper side of the regulating portion and formed by a truncated square pyramidal surface so as to guide the device under test 12 to the contacts 44.

The plurality of contacts 42 correspond to the slits 48 in a one-to-one relationship and belong to either one of a pair of contact rows on the left and right corresponding to the rows of the conductive portions 22 and the slits 48.

Figure 5:
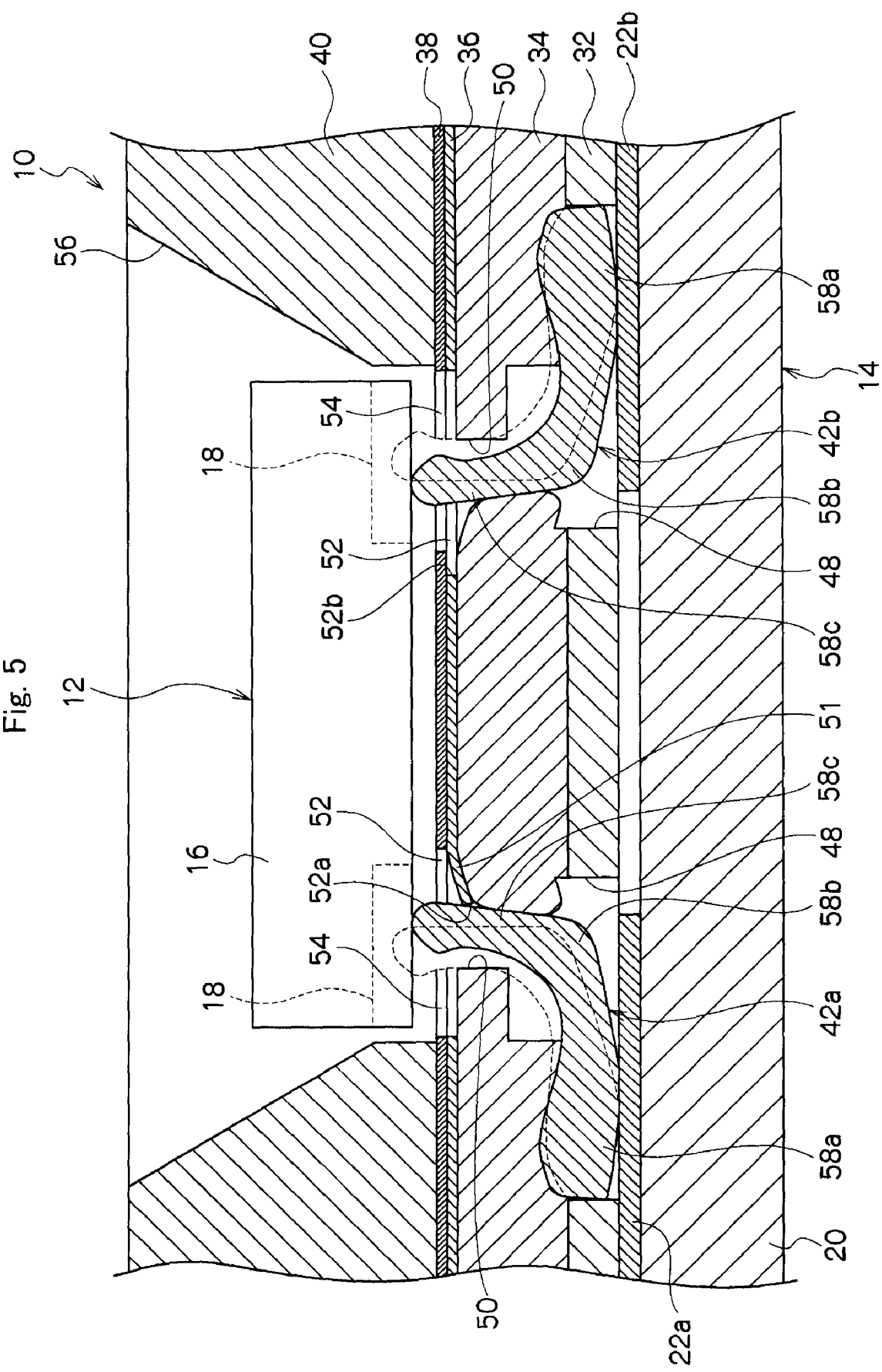
FIG. 5 is an enlarged cross-sectional view of an embodiment of a portion of the electrical connecting apparatus shown in FIG. 1.

Each contact 42 has a probe rear portion 58a having an external surface curved and deformed slightly obliquely upward and extending in the right-left direction within the electrical insulating plate 32, a deformation portion 58b continuing into the tip end side of the probe rear portion 58a and having an external surface curved and deformed obliquely upward, and a probe tip portion 58c continuing into the tip end side of the deformation portion 58b and penetrating the elastic plate 34, the conductive plate 36, and the electrical insulating sheet 38 to extend upward and project in the opening 56, as shown in FIG. 5.

The contacts 42 are classified into two contact rows spaced in the right-left direction and correspond to the conductive portions 22a, 22b or 22c in one-to-one relationship. Thus, the contacts 42 are classified into three groups consisting of a contact group of the contacts 42a for grounding, a contact group of the contacts 42b for signaling, and a contact group of the contacts 42c for powering and are spaced in the front-back direction per contact group.

The contact 42a is located so that its probe tip portion 58c may be opposed to the first hole portion 52a (tongue piece 51), and the contacts 42b and 42c are located so that their probe tip portions 58c may be opposed to portions defining the second hole portions 52b.

The probe rear portion 58a of each contact 42 is received in the corresponding slit 48 in a state of extending to the side of the opponent contact group, and the rear end abuts on the inward surface located on the rear end side out of the surfaces defining the corresponding slit 48.

Each contact 42 is arranged in the housing 30 by the electrical insulating plate 32, the elastic plate 34 or the like, and so on in a state where the probe tip portion 58c projects to the opening 56 via the holes 50, 52, and 54, and where the external surface of the probe rear portion 58a curved and deformed obliquely upward abuts on the conductive portion 22. The upper end of the probe tip portion 58c of each contact 42 acts as a probe tip contacted with the electrode portion 18 of the device under test 12.

Each contact 42 is held in the housing 30 in a stable manner as the probe rear portion 58a is received in the corresponding slit 48 in a state of interference fit (that is, in a state where the probe rear portion 58a is clamped by the portions defining the slit 48), and the probe tip portion 58c broadens out the hole 50 and penetrates the holes 50 and 54. However, even in such a state, the probe tip portion 58c of each contact 42 does not contact with the conductive plate 36.

The housing 30, the electrical insulating plate 32, the elastic plate 34, the conductive plate 36, the electrical insulating sheet 38, and the guide 40 are positioned mutually and against the board 14 by a plurality of positioning pins 60 (refer to FIG. 1) penetrating them and reaching the board 14 and are incorporated into the board 14 by a plurality of screw members 62 (refer to FIG. 1) penetrating them and screwed in the board 14 in a state where they are piled as above, and where the contacts 42 are kept as above.

The conductive plate 36 is electrically connected to the housing 30 and the conductive portions 22a for grounding and is maintained at the ground potential. The guide 40 is also maintained at the ground potential. The electrical insulating sheet 38 located on the uppermost layer not only prevents the guide 40 from contacting with the conductive plate 36 and being electrically connected to the conductive plate 36 but also prevents the device under test 12 received in the opening 56 from contacting with the conductive plate 36 and being electrically connected to the conductive plate 36.

At the time of a test, the device under test 12 is arranged in the opening 56 of the guide 40 from the upper side in a state where its electrode portions 18 direct downward. Accordingly, the electrode portions 18 of the device under test 12 are received on the probe tips of the contacts 42. At this time, since the device under test 12 is guided by the inclined portion of the opening 56 of the guide 40 and reaches the regulating portion of the opening 56, the electrode portions 18 of the device under test 12 may be brought into contact with the probe tips of the contacts 42 easily and reliably.

In the above state, the electrical connecting apparatus 10 and the device under test 12 approach relative to one another, and the probe tips of the contacts 42 and the electrode portions 18 of the device under test 12 are thrust relative to one another. Consequently, each contact 42 is rotationally moved or is rotationally displaced while being thrust by the electrode portions 18 of the device under test 12 and the conductive portions 22 of the board 14.

In the aforementioned rotational displacement of the contact 42, in a state of being prevented from going back as the rear end of the probe rear portion 58a abuts on the inward surface defining the slit 48 of the electrical insulating plate 32, each contact 42 is angularly rotationally displaced by an overdriving acting on it from the state shown with the dashed line to the state shown with the solid line in FIG. 5. Accordingly, each contact 42 reliably contacts with the conductive portion 22 of the board 14 and the electrode portion 18 of the device under test 12.

Also, when the probe tip of the contact 42 and the electrode portion 18 of the device under test 12 are thrust relative to each other, the contact 42 is displaced while elastically deforming the elastic plate 34. Thus, the contact pressure of the conductive portion 22 of the board 14 and the electrode portion 18 of the device under test 12 with the contact 42 is increased, and the contact 42 contacts with the conductive portion 22 of the board 14 and the electrode portion 18 of the device under test 12 more reliably.

The forces acting on the contacts 42 when the probe tips of the contacts 42 and the electrode portions 18 of the device under test 12 are thrust relative to one another are offset by the fact that the forces acting on the contacts 42 on both the contact rows act in the opposite directions to each other since the extending directions of the contacts 42 on both the contact rows are opposite.

In a state of being incorporated in the electrical connecting apparatus 10 described above, the probe tip portion 58c of each contact 42 penetrates the holes 50, 52, and 54 but does not contact the conductive plate 36.

However, when overdriving acts on the contacts 42, as for the contact 42a, the distance from the probe tip portion 58c to one end portion of the first hole portion 52a in the rotational displacement direction (right-left direction) is shorter by the tongue piece 51 than the distance from the probe tip portion 58c of the contact 42b to that of the second hole portion 52b in the same direction.

Thus, the contact 42a abuts on the tongue piece 51 forming the first hole portion 52a and elastically deforms the tongue piece 51 downward, as shown with the solid line in FIG. 5. By doing so, the contact 42a is electrically connected to the conductive plate 36.

On the other hand, as for the contact 42b or 42c, the distance from the probe tip portion 58c of the contact 42b or 42c to one end portion of the second hole portion 52b in the same direction is longer than the distance from the probe tip portion 58c of the contact 42a to that of the first hole portion 52a in the same direction. That is, a tongue piece corresponding to the tongue piece 51 is not provided on the conductive plate 36.

Thus, the contact 42b or 42c does not abut on the edge portion defining the second hole portion 52b as shown with the solid line in FIG. 5 even when overdriving acts on it. Consequently, the contact 42b or 42c is not electrically connected to the conductive plate 36.

In a state where overdriving acts on the contacts 42 as above, power supply voltages and electric signals for a test are supplied to the device under test via predetermined contacts 42, and electric signals from the device under test 12 are taken out to a tester via other predetermined contacts 42. The tester tests whether or not the device under test 12 is good, using the taken-out signals.

In the electrical connecting apparatus 10, application of the ground potential to the device under test 12 is performed via the probe tip portion 58c of the contact 42a from the conductive plate 36 through the conductive portion 22a of the board 14 and the conductive housing 30.

On the other hand, transfer of other electric signals such as signals for a test, another power supply potential, or the like to and from the device under test 12 is performed via the conductive portion 22b or 22c of the board 14 and the deformation portion 58b and the probe tip portion 58c of the contact 42b or 42c. Accordingly, the effective length of the electrical path for grounding is shorter than that for electric signals flowing in the contact 42b or 42c.

As described above, according to an embodiment of the electrical connecting apparatus 10, when overdriving acts on the contacts 42, the probe tip portions 58c of the contacts 42a abut on the conductive plate 36 while the probe tip portions 58c of the other contacts 42b and 42c do not abut on the conductive plate 36. This reduces the apparent resistance value of the electrical path for grounding in spite of a simple structure of the conductive plate 36 itself, in combination with using J-shaped or L-shaped contacts. As a result, a test using high frequency signals may be performed accurately.

Figure 10:
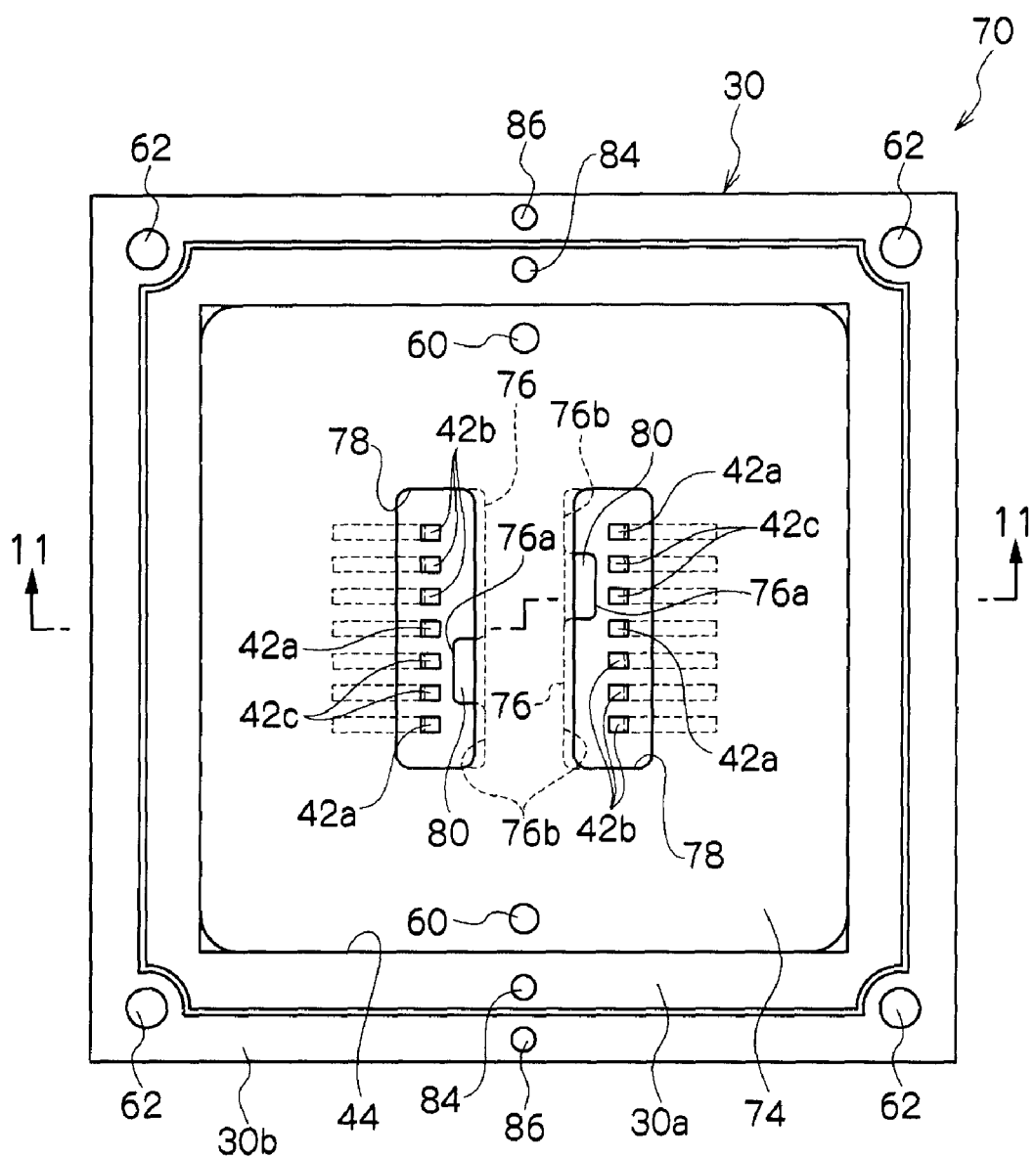
FIG. 10 is a plan view showing a second embodiment of the electrical connecting apparatus.
Figure 11:
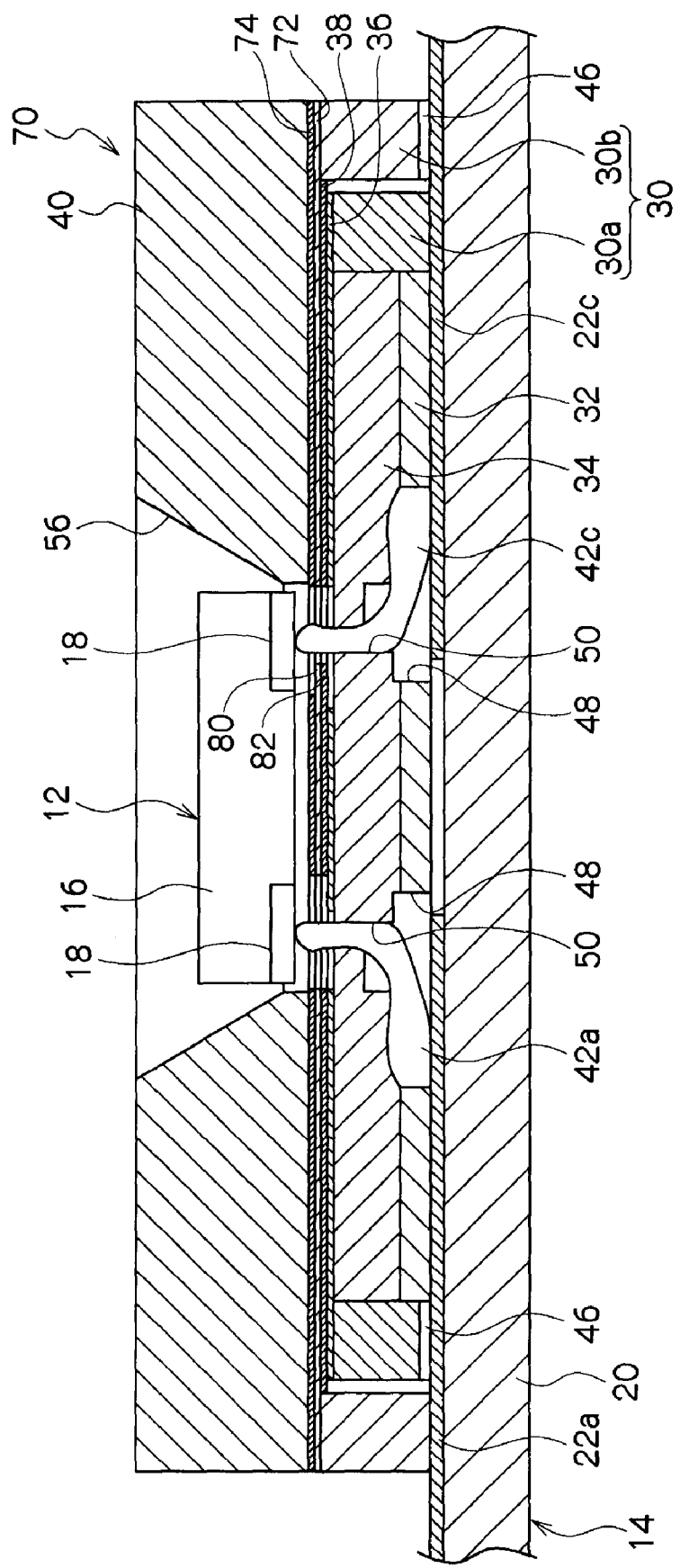
FIG. 11 is a cross-sectional view obtained along the line 11-11 in FIG. 10.
Figure 12:
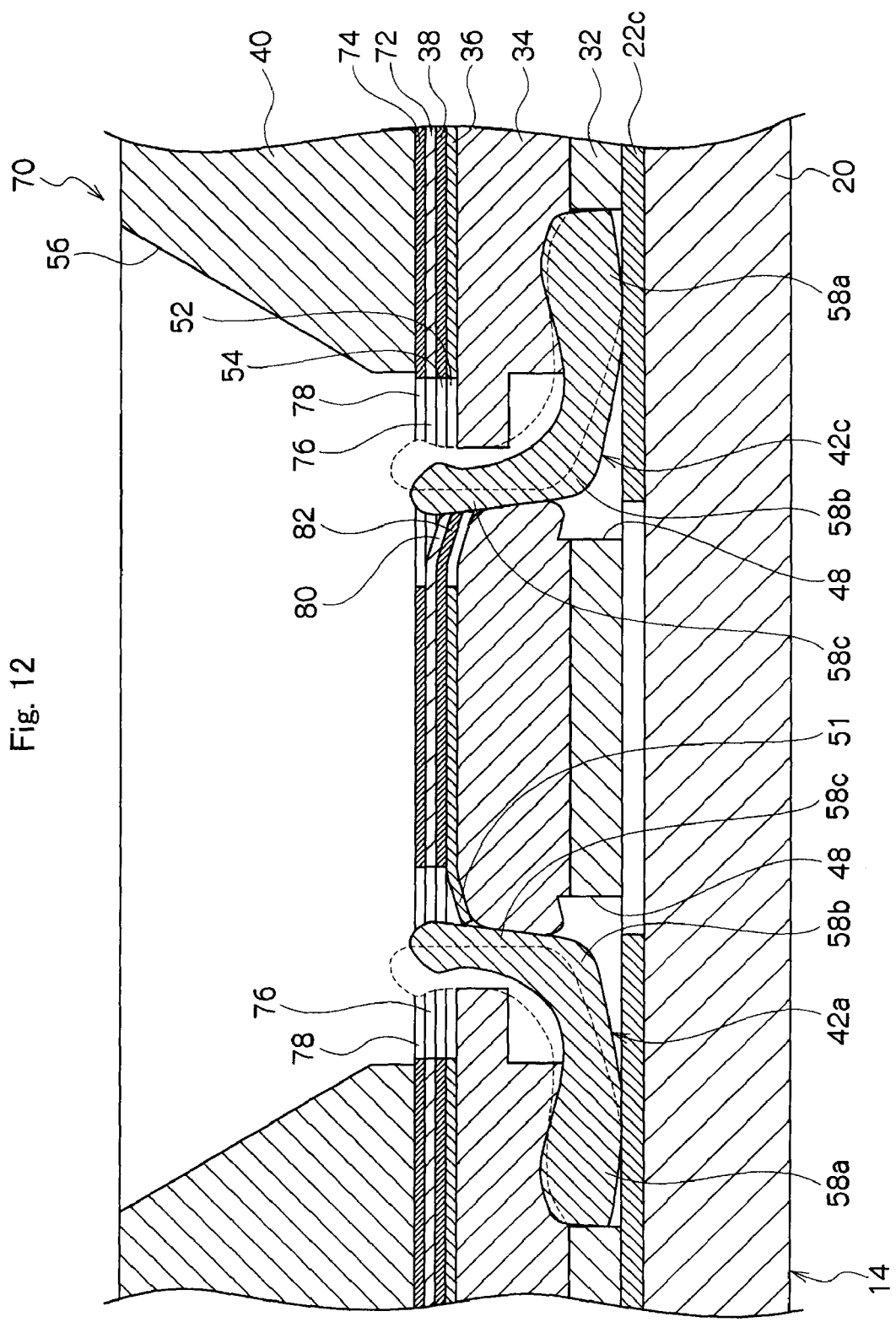
FIG. 12 is an enlarged cross-sectional view of an embodiment of a portion of the electrical connecting apparatus shown in FIG. 10.

Referring to FIGS. 10 to 12, an embodiment of an electrical connecting apparatus 70 makes the housing 30 consist of a first housing 30a having the opening 44 and a rectangular second housing 30b coaxially arranged to be spaced around the first housing 30a and also includes a conductive sheet 72 arranged to be piled on the electrical insulating sheet 38 and an electrical insulating sheet 74 arranged to be piled on the conductive sheet 72.

The first and second housings 30a and 30b are electrically insulated by a space between both housings 30a and 30b.

However, an electrical insulating material may be arranged in the aforementioned space to electrically insulate the first and second housings 30a and 30b.

The first and second housings 30a and 30b are made of conductive materials so as to be formed in rectangular shapes having approximately the same sizes as those of the conductive plate 36 and the conductive sheet 72, respectively. The height dimension of the first housing 30a is shorter by the thickness of the conductive plate 36 and the electrical insulating sheet 38 than the height dimension of the second housing 30b.

The first and second housings 30a and 30b are electrically connected to the conductive plate 36 and the conductive sheet 72, respectively. For this reason, the first housing 30a connects the conductive plate 36 to the conductive portions 22a for grounding, and the second housing 30b connects the conductive sheet 72 to the conductive portions 22c for powering. However, the second housing 30b does not contact with the conductive plate 36.

The conductive sheet 72 and the electrical insulating sheet 74 have a pair of holes 76 and a pair of elongated holes 78 opposed to the holes 52 of the conductive plate 36 and the elongated holes 54 of the electrical insulating sheet 38, respectively, and are arranged to be plied on the electrical insulating sheet 38 and the conductive sheet 72.

The elongated holes 76 of the conductive sheet 72 are spaced in the right-left direction and extend over the elongated holes 54 in the front-back direction so as to be located over the elongated holes 54 of the electrical insulating sheet 38 in a similar manner to that of the elongated holes 52 of the conductive plate 36. On the other hand, the elongated holes 78 of the electrical insulating sheet 74 are spaced in the right-left direction and extend over the elongated holes 52 in the front-back direction so as to be located over the elongated holes 76 of the conductive sheet 72 in a similar manner to that of the elongated holes 54 of the electrical insulating sheet 38

Portions located on the mutually near sides of both the elongated holes 76 of the conductive sheet 72 are formed in uneven shapes by tongue pieces 80 projecting within the elongated holes 76 so that the distances from the other sides (lengths in the right-left direction) may differ at a plurality of hole portions. Accordingly, a plurality of third and fourth hole portions 76a and 76b (refer to FIG. 10) having different lengths in the right-left direction and communicating in the front-back direction are formed.

Each third hole portion 76a is formed at a position corresponding to the contact 42c for powering. Thus, the probe tip portion 58c of the contact 42c for powering is opposed to the tongue piece 80. The length of the third hole portion 76a in the right-left direction is made to be shorter than the length of the fourth hole portion 76b in the right-left direction by the tongue piece 80.

The fourth hole portion 76b is formed at a position corresponding to the contact 42a for grounding or the contact 42b for signaling.

Each elongated hole 78 of the electrical insulating sheet 74 is formed in a rectangular shape elongated in the front-back direction. The position of each elongated hole 78 on one end side (base end side) in the right-left direction corresponds to those of the elongated holes 52, 54, and 76.

However, the position of each elongated hole 78 on the other end side in the right-left direction is located further on one end side than the position of the elongated hole 76 on the other end side in the right-left direction so that the length of each elongated hole 76 in the right-left direction may be longer than the length of the third hole portion 76a in the right-left direction and may be shorter than the length of the fourth hole portion 76b in the right-left direction.

In the example shown in the figures, the electrical insulating sheet 38 has tongue pieces 82 similar to the tongue pieces 80 of the conductive sheet 72. Each tongue piece 82 is formed at the same position as that of the tongue piece 80 in a planar view.

The first and second housings 30a and 30b, the electrical insulating sheet 74, the conductive sheet 72, the electrical insulating sheet 38, and the conductive plate 36 are mutually positioned by a plurality of positioning pins 84 (refer to FIG. 10) penetrating the electrical insulating sheet 74, the conductive sheet 72, the electrical insulating sheet 38 and the conductive plate 36 and reaching the first housings 30a, and a plurality of positioning pins 86 (refer to FIG. 10) penetrating the electrical insulating sheet 74 and the conductive sheet 72 and reaching the second housings 30b The electrical insulating sheet 74 located on the uppermost layer not only prevents the guide 40 from contacting with the conductive sheet 72 and being electrically connected to the conductive sheet 72 but also prevents the device under test 12 received in the opening 56 from contacting with the conductive sheet 72 and being electrically connected to the conductive sheet 72.

In the electrical connecting apparatus 70, when overdriving acts on the contacts 42, the contacts 42a and 42b act in a similar manner to that in the case of the electrical connecting apparatus 10. On the other hand, the distance from the probe tip portion 58c of the contact 42c to one end portion of the third hole portion 76a in the rotational displacement direction is shorter by the tongue piece 80 than the distance from the probe tip portion 58c of the contact 42b to that of the fourth hole portion 76b in the same direction.

Thus, the contact 42c abuts on the tongue piece 80 defining the third hole portion 76a and elastically deforms the tongue piece 80, as shown with the solid line in FIG. 12. By doing so, the contact 42c is electrically connected to the conductive sheet 72. At this time, the tongue piece 82 of the electrical insulating sheet 38 is elastically deformed downward together with the tongue piece 80 and prevents the probe tip portion 58c of the contact 42c from contacting with the conductive plate 36.

On the other hand, each probe tip portion 58c of the contact 42a for grounding or the contact 42b for signaling does not contact the conductive sheet 72 since it is located at the fourth hole portion 76b.

In the electrical connecting apparatus 70, the ground potential is applied to the contacts 42a for grounding via the conductive portions 22a, the first housing 30a, and the conductive plate 36. Also, supply and taking-out of signals to and from the device under test 12 are performed via the contacts 42b, the conductive portions 22b, or the like.

On the other hand, application of the positive (or negative) power supply potential to the device under test 12 is performed from the conductive portions 22c for powering, the second housing 30b, and the conductive sheet 72 via the probe tip portions 58c of the contacts 42c.

As a result of the above, according to the electrical connecting apparatus 70, the effective length of the electrical path for the power supply potential is further shorter than that for electric signals flowing in the contacts 42b when compared with the case of the electrical connecting apparatus 10. Consequently, an test high frequency signals can be performed more accurately.

As described above, according to the electrical connecting apparatus 70, when overdriving acts on the contacts 42, the probe tip portions 58c of the contacts 42a and 42c for grounding and powering abut on the conductive plate 36 and the conductive sheet 72, respectively. This reduces the apparent resistance values of the electrical paths for grounding and powering. The probe tip portions 58c of the contacts 42b for signaling do not abut on the conductive plate 36 or the conductive sheet 72.

Figure 13:
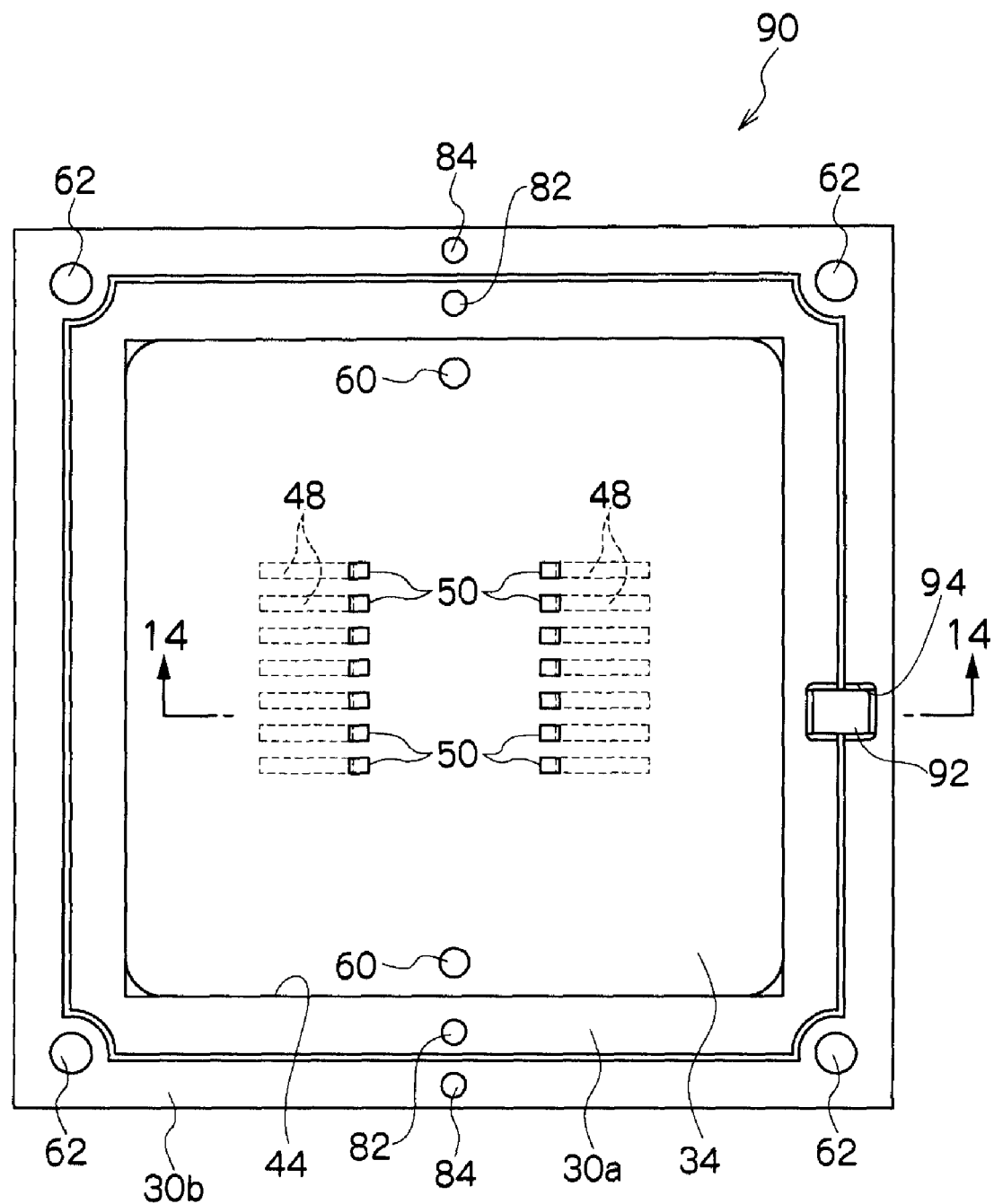
FIG. 13 is a plan view showing a third embodiment of the electrical connecting apparatus.
Figure 14:
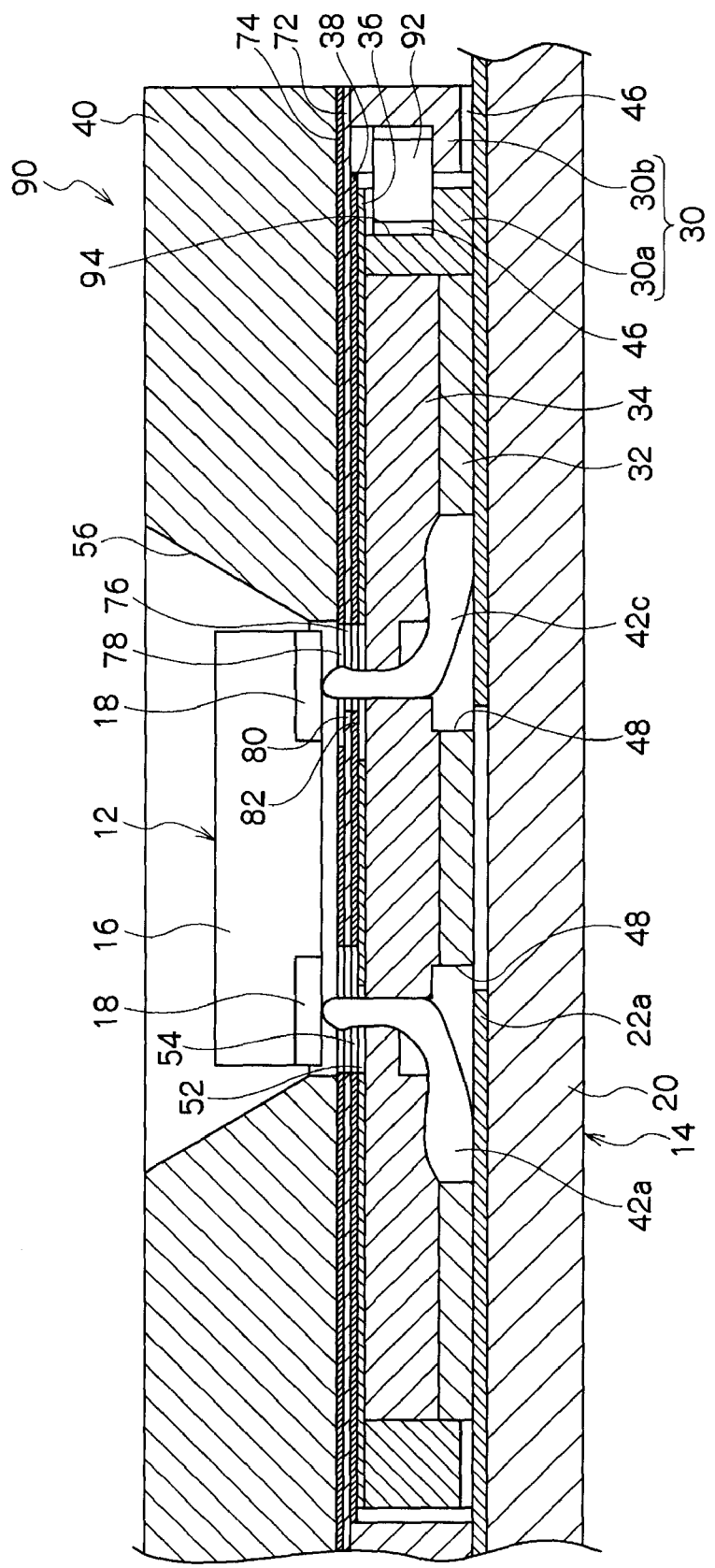
FIG. 14 an enlarged cross-sectional view obtained along the line 14-14 in FIG. 13.

Referring to FIGS. 13 and 14, an embodiment of an electrical connecting apparatus 90 includes a capacitor 92 arranged in a recess 94 provided in the first and second housings 30a and 30b. The capacitor 92 acts to apply the power supply potential with its one and the other terminals electrically connected to the first and second housings 30a and 30b, respectively.

According to an embodiment of the electrical connecting apparatus 90, since the positive (or negative) power supply potential gets closer to the device under test 12, and the electrical effective length is shorter, a test using high frequency signals may be performed more accurately.

The embodiments described here may be applied to an electrical connecting apparatus for use in an electrical test of a device under test having a plurality of electrode portions such as lead electrodes projecting in parallel from the main body, as well as a device under test having the plurality of electrode portions 18 on one surface of the main body portion 16.

The embodiments described here may be applied to an electrical connecting apparatus using contacts each formed in a shape other than those in the above embodiments, an electrical connecting apparatus for an electrical test of another flat-plate-like device under test such as a liquid crystal display panel, and an electrical connecting apparatus used in a state where the upper and lower sides are reversed from those in the above embodiments.

Each elongated hole 52 or 76 may be formed by the first and second hole portions 52a and 52b or the third and fourth hole portions 76a and 76b each of which is an independent discontinuous slit area extending in the right-left direction.

The described subject matter is not limited to the above embodiments but may be altered in various ways without departing from the spirit and scope of the disclosure.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. An electrical connecting apparatus electrically connecting a conductive portion formed on one surface of a board to an electrode portion of a device under test, comprising:

an electrical insulating plate; an elastic plate made of an electrical insulating material arranged on said electrical insulating plate; a sheet-like conductive plate arranged on said elastic plate; and a plurality of contacts each having a probe rear portion extending in a right-left direction within said electrical insulating plate, a deformation portion continuing into the tip end side of said probe rear portion and having an external surface extended upward, and a probe tip portion continuing into the tip end side of said deformation portion and penetrating said elastic plate and said conductive plate to extend upward, wherein said plurality of contacts comprise first and second contacts, and wherein said conductive plate comprises a hole area having at least one first hole portion allowing said probe tip portion of said first contact to abut to the conductive plate and a plurality of second hole portions not allowing said probe tip portions of said second contacts to abut thereon regardless of whether or not overdriving acts on said contacts.

2. The electrical connecting apparatus according to claim 1, wherein said conductive plate has a tongue piece projecting toward said first hole portion so that said probe tip portion of said first contact may abut thereon when overdriving acts on said contacts.

3. The electrical connecting apparatus according to claim 1, wherein the length of said first hole portion in said right-left direction is shorter than the length of said second hole portion in said right-left direction.

4. The electrical connecting apparatus according to claim 1, wherein said first and second hole portions communicate with one another to cooperatively form an elongated hole extended in a front-back direction.

5. The electrical connecting apparatus according to claim 1, wherein each of said first and second hole portions includes an independent slit extending in said right-left direction.

6. The electrical connecting apparatus according to claim 1, wherein said electrical insulating plate has a plurality of slits extending in said right-left direction, and
wherein said probe rear portion is received in said slit, and its rear end abuts on a surface defining said slit.

7. The electrical connecting apparatus according to claim 1, further comprising an electrical insulating sheet arranged on said conductive plate; and a conductive sheet arranged on said electrical insulating sheet,
wherein said probe tip portions of said plurality of contacts penetrate said electrical insulating sheet and said conductive sheet and extend upward,
wherein said contacts comprise at least one said first contact and a plurality of said second contacts, and
wherein said conductive sheet comprises a second hole area having a third hole portion allowing said probe tip portion of at least one contact out of said second contacts to abut to the conductive sheet and a fourth hole portion not allowing said probe tip portions of the remaining contacts out of said second contacts to abut thereon regardless of whether or not overdriving acts on said contacts.

8. The electrical connecting apparatus according to claim 7, further comprising a housing having an opening opened to both sides in its thickness direction, said electrical insulating plate and said elastic plate being arranged in said opening,
wherein said housing comprises a plurality of cut-outs formed to stride over said conductive portions and extending in said right-left direction, and said conductive plate is arranged on said elastic plate and said housing.

9. The electrical connecting apparatus according to claim 8, wherein said housing includes a first housing having said opening and a second housing coaxially arranged around said first housing.

10. The electrical connecting apparatus according to claim 9, wherein said first and second housings are conductive, said conductive plate is electrically connected to said first housing, and said conductive sheet is electrically connected to said second housing.

11. The electrical connecting apparatus according to claim 10, further comprising a capacitor arranged in said first or second housing, and one and the other terminals of said capacitor are electrically connected to said first and second housings, respectively.

12. The electrical connecting apparatus according to claim 7, further comprising a second electrical insulating sheet arranged on said conductive plate or said conductive sheet; and a guide arranged on said second electrical insulating sheet and having an opening to receive said device under test,
wherein said probe tip portion further penetrates said second electrical insulating sheet and makes its tip end project upward.

* * * * *